(12) United States Patent
Ishii et al.

(10) Patent No.: US 11,139,435 B2
(45) Date of Patent: *Oct. 5, 2021

(54) ORGANIC LIGHT EMITTING ELEMENT (71) Applicant: CANON KABUSHIKI KAISHA, Tokyo (JP)

(72) Inventors: Ryuji Ishii, Yokohama (JP); Hiroki Ohrui, Kawasaki (JP); Kei Tagami, Yokohama (JP); Masumi Itabashi, Kodaira (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 261 days.

This patent is subject to a terminal disclaimer.

(21) Appl. No.: 16/018,789

(22) Filed: Jun. 26, 2018

(65) Prior Publication Data
US 2018/0301633 A1  Oct. 18, 2018

Related U.S. Application Data (63) Continuation of application No. 14/895,399, filed as application No. PCT/JP2014/063524 on May 15, 2014, now Pat. No. 10,032,987.

(30) Foreign Application Priority Data

Jun. 11, 2013  (JP) ................................. 2013-122500

(51) Int. Cl.
*H01L 51/00* (2006.01)
*H01L 51/50* (2006.01)
(Continued)

(52) U.S. Cl.
CPC ........ *H01L 51/0058* (2013.01); *C09K 11/025* (2013.01); *C09K 11/06* (2013.01);
(Continued)

(58) Field of Classification Search
CPC .... C07D 251/24; C09K 11/025; C09K 11/06; H01L 51/0052; H01L 51/0054;
(Continued)

(56) References Cited

U.S. PATENT DOCUMENTS 6,361,886 B2  3/2002 Shi et al.
9,142,782 B2  9/2015 Pillow et al.
(Continued)

FOREIGN PATENT DOCUMENTS

JP    4772942 B    9/2011
JP    2013-51159 A    3/2013
(Continued)

OTHER PUBLICATIONS

Appl. Phys. Lett., vol. 85, pp. 4848-4850 (2004). (Year: 2004).*
(Continued)

*Primary Examiner* — Dawn L Garrett
(74) *Attorney, Agent, or Firm* — Venable LLP (57) ABSTRACT

Provided is an organic light emitting element including: an anode; a cathode; and an organic compound layer formed between the anode and the cathode and including a hole injection layer, a hole transport layer, and an emission layer, in which: the emission layer includes a host and a dopant; the hole transport layer includes a hole transport material having multiple aromatic hydrocarbon skeletons and a single bond for linking the aromatic hydrocarbon skeletons; the hole transport material has a triplet level $T_1$ of 1.8 eV or more; the hole transport material has a hole mobility of $1 \times 10^{-5}$ cm$^2$/Vs or more; and the hole transport layer and the emission layer satisfy relationships represented by the following expression (1):

$$|\text{reduction potential of hole transport material}| - |\text{reduction potential of host}| > 0.1 \text{ V} \quad (1)$$

(Continued)

and the following expression (2):

$$|\text{HOMO level of hole transport material} - \text{HOMO level of host}| < 0.1 \text{ eV} \quad (2).$$

20 Claims, 1 Drawing Sheet

(51) Int. Cl.
  *C09K 11/06* (2006.01)
  *C09K 11/02* (2006.01)
  *G03G 15/04* (2006.01)
  *G09G 3/3208* (2016.01)

(52) U.S. Cl.
  CPC ..... *G03G 15/04054* (2013.01); *G09G 3/3208* (2013.01); *H01L 51/006* (2013.01); *H01L 51/0054* (2013.01); *H01L 51/0055* (2013.01); *H01L 51/0056* (2013.01); *H01L 51/5004* (2013.01); *C09K 2211/1007* (2013.01); *C09K 2211/1011* (2013.01); *H01L 51/504* (2013.01); *H01L 51/5016* (2013.01); *H01L 51/5024* (2013.01); *H01L 51/5036* (2013.01); *H01L 51/5056* (2013.01); *H01L 51/5088* (2013.01); *H01L 2251/552* (2013.01); *H01L 2251/554* (2013.01)

(58) Field of Classification Search
  CPC ............. H01L 51/0055; H01L 51/0058; H01L 51/0067; H01L 51/0077; H01L 51/5076; H01L 51/5092
  See application file for complete search history.

(56) References Cited

U.S. PATENT DOCUMENTS

| | | | |
|---|---|---|---|
| 10,032,987 B2 * | 7/2018 | Ishii | H01L 51/5004 |
| 2001/0051285 A1 | 12/2001 | Shi et al. | |
| 2004/0124766 A1 * | 7/2004 | Nakagawa | H01L 51/0073 313/504 |
| 2006/0240281 A1 * | 10/2006 | Liao | H05B 33/26 428/690 |
| 2011/0012504 A1 | 1/2011 | Matsuda | |
| 2011/0198582 A1 | 8/2011 | Horiuchi et al. | |
| 2011/0279025 A1 * | 11/2011 | Kosuge | H01L 51/0054 313/504 |
| 2013/0187145 A1 | 7/2013 | Pegington et al. | |
| 2013/0187146 A1 | 7/2013 | Pillow et al. | |
| 2013/0187147 A1 | 7/2013 | King et al. | |
| 2013/0194477 A1 | 8/2013 | Ito | |
| 2013/0200348 A1 | 8/2013 | Pillow et al. | |
| 2013/0234119 A1 * | 9/2013 | Mizuki | H01L 51/0072 257/40 |
| 2016/0093809 A1 | 3/2016 | Ikari et al. | |

FOREIGN PATENT DOCUMENTS

| | | |
|---|---|---|
| WO | 2011/161425 A | 12/2011 |
| WO | 2012/176674 A | 12/2012 |

OTHER PUBLICATIONS

Electrochemistry Communications, vol. 5, (2003), pp. 373-377 (Year: 2003).*

F. Ante, "Contact Doping and Ultrathin Gate Dielectrics for Nanoscale Organic Thin-Film Transistors", small 2011, 7, No. 9, pp. 1186-1191.

"Proceedings of the 11th Organic EL Symposium," Yuki-EL-Tohronkai, p. 3-4 (2010) including partial English translation.

Ahlrichs, et al., "Electronic Structure Calculations on Workstation Computers: The Program System TURBOMOLE," Chemical Physics Letters, vol. 162, No. 3 (5 pages) (1989).

* cited by examiner

ORGANIC LIGHT EMITTING ELEMENT

The present application is a continuation of U.S. patent application Ser. No. 14/895,399, filed Dec. 2, 2015, which is a national stage entry of PCT/JP2014/063524, filed, May 15, 2014, which claims priority to JP 2013-122500, filed Jun. 11, 2013, the entire disclosure of each of which is incorporated by reference herein.

TECHNICAL FIELD

The present invention relates to an organic light emitting element.

BACKGROUND ART

An organic light emitting element is an electronic element including an anode, a cathode, and a thin film containing a luminous organic compound, formed between the anode and the cathode. A voltage is applied between the anode and the cathode to inject a hole and an electron, whereby the organic light emitting element is driven. Specifically, the hole and electron applied from the respective electrodes recombine in the element (the thin film containing the luminous organic compound), and when the luminous organic compound in an excited state (exciton) produced by the recombination returns to its ground state, light is radiated. The organic light emitting element is an element that utilizes the light to be radiated.

From the viewpoint of a light emission principle, light emissions of the organic light emitting element can be classified into two kinds, i.e., fluorescent emission utilizing a singlet exciton and phosphorescent emission utilizing a triplet exciton. In this case, in principle, a ratio between the probability that the singlet exciton is produced and the probability that the triplet exciton is produced is 1:3, and hence it is found that the triplet exciton is more likely to be produced. Accordingly, in the case of an organic light emitting element utilizing fluorescence, the ratio at which the fluorescence can be utilized as light emission (internal quantum efficiency) is 25% at maximum. Meanwhile, in the case of an organic light emitting element utilizing phosphorescence, its internal quantum efficiency is 75% at maximum.

When an organic light emitting element is applied to a constituent member for a full-color display in a cellular phone, television, or the like, improvements in efficiency and durability of the organic light emitting element have been realized in each of a red color and a green color by utilizing phosphorescence. In a blue color, however, the fact that the durability of an organic light emitting element that emits blue light is problematic and hence its continuous driving lifetime is short has been perceived as a problem. In view of the foregoing, an organic light emitting element that has relatively good durability and utilizes fluorescence has been used in the blue color. However, the element has caused a problem from the viewpoint of luminous efficiency because the probability that a singlet exciton is produced is low as described above.

In this connection, methods proposed in PTL 1 and NPL 1 are each given as a method of improving the luminous efficiency of an organic light emitting element that utilizes fluorescence and whose luminescent color is a blue color.

By the way, a method involving utilizing a triplet exciton, which has not been effectively utilized heretofore, in fluorescent emission has been proposed as a method of improving the luminous efficiency of an organic light emitting element utilizing fluorescence. The method is a method called triplet-triplet annihilation (TTA) and a specific light emission mechanism is as described below. First, multiple triplet excitons are produced in an emission layer and then two of the triplet excitons collide with each other to annihilate. At that time, a singlet exciton is produced. Thus, singlet excitons needed for the fluorescent emission increase in number and hence the fluorescent emission increases in extent. As a result, the internal quantum efficiency of the element becomes 62.5% at maximum and the luminous efficiency improves. Here, when the ratio at which the fluorescent emission can be extracted as light emission to the outside of the element (external quantum efficiency (EQE) =internal quantum efficiency×light extraction efficiency) is calculated, the calculated value exceeds 5% as the upper limit of the related art (when it is assumed that the light extraction efficiency is 20%) and can be set to 12.5% at maximum.

An organic light emitting element using an anthracene derivative as a host for its emission layer has been proposed as an organic light emitting element that emits blue light and utilizes the TTA, and it has been reported that the element has high luminous efficiency. For example, in NPL 1, the external quantum efficiency of the organic light emitting element that emits blue light is about 7%, which exceeds the upper limit of the related art. However, even when the TTA is utilized, an upper limit for the external quantum efficiency of the organic light emitting element is 12.5% and hence the efficiency can be said to have room for additional improvement. By the way, in NPL 1, an aromatic amine derivative (α-NPD) is incorporated into a hole transport layer and the aromatic amine derivative may cause a reduction in luminous efficiency.

The aromatic amine derivative generally has strong electron-donating property. Accordingly, the derivative interacts with a constituent material for an emission layer and the interaction is responsible for emission quenching. In view of the foregoing, there has been proposed an organic light emitting element using an organic compound except the aromatic amine derivative as a constituent material for its hole transport layer for an improvement in luminous efficiency. For example, PTL 1 discloses, as organic compounds except the aromatic amine derivative, an anthracene derivative, arylethylene and arylacetylene derivatives, and a polyphenylene hydrocarbon. In addition, in Examples of PTL 1, an organic light emitting element using an anthracene derivative as its hole transport layer shows an improvement in luminous efficiency in each of the red color and the green color.

However, the triplet energy level ($T_1$) of the anthracene derivative as a constituent material for the hole transport layer is of about the same magnitude as that of a host for the emission layer of the element. Accordingly, when the anthracene derivative is used as a constituent material for the hole transport layer in the organic light emitting element utilizing the TTA proposed in NPL 1, no triplet exciton can be trapped in its emission layer. Accordingly, a triplet exciton leaks to a layer adjacent to the emission layer (such as the hole transport layer), which leads to a reduction in luminous efficiency. Therefore, an organic compound whose $T_1$ is higher than that of the anthracene derivative (1.8 eV or less) has been desired.

However, PTL 1 discloses that an organic light emitting element using an organic compound except the anthracene derivative, the compound being considered to have a high $T_1$, is not improved in luminous efficiency to a very large extent in each of the red color and the green color, and moreover, the element causes an increase in driving voltage. The same may hold true for an organic light emitting element that emits blue light.

CITATION LIST

Patent Literature

PTL 1: Japanese Patent No. 4772942

Non Patent Literature

NPL 1: Proceedings of the 11th Organic EL Symposium (Yuki EL Tohronkai) (P3-4)
NPL 2: Small 2011, 7, No. 9, 1186-1191
NPL 3: R. Ahlrichs, M. Baer, M. Haeser, H. Horn, and C. Koelmel Electronic structure calculations on workstation computers: the program system TURBOMOLE Chem. Phys. Lett. 162-165 (1989)

SUMMARY OF INVENTION

The present invention has been made to solve the problems, and an object of the present invention is to provide an organic light emitting element, in particular, an organic light emitting element that emits blue light, which has a low driving voltage, and is excellent in luminous efficiency and durability.

According to one embodiment of the present invention, there is provided an organic light emitting element including: an anode; a cathode; and an organic compound layer formed between the anode and the cathode and including a hole injection layer, a hole transport layer, and an emission layer, in which: the emission layer includes a host and a dopant; the hole transport layer includes a hole transport material having multiple aromatic hydrocarbon skeletons and a single bond for linking the aromatic hydrocarbon skeletons; the hole transport material has a triplet level $T_1$ of 1.8 eV or more; the hole transport material has a hole mobility of $1 \times 10^{-5}$ cm$^2$/Vs or more; and the hole transport layer and the emission layer satisfy relationships represented by the following expression (1):

$$|\text{reduction potential of hole transport material}|-|\text{reduction potential of host}| > 0.1 \text{ V} \quad (1)$$

and the following expression (2):

$$|\text{HOMO level of hole transport material} - \text{HOMO level of host}| < 0.1 \text{ eV} \quad (2).$$

Further features of the present invention will become apparent from the following description of exemplary embodiments with reference to the attached drawings.

DESCRIPTION OF EMBODIMENTS

Preferred embodiments of the present invention will now be described in detail in accordance with the accompanying drawings.

(1) Organic Light Emitting Element

An organic light emitting element of the present invention includes: an anode; a cathode; and an organic compound layer formed between the anode and the cathode and including at least a hole injection layer, a hole transport layer, and an emission layer. In other words, in the organic light emitting element of the present invention, a hole produced from the anode is first injected into the hole injection layer, and is then transported to the emission layer via the hole injection layer and the hole transport layer.

In the present invention, the emission layer includes a host and a dopant. In the present invention, the hole transport layer includes a hole transport material having multiple aromatic hydrocarbon skeletons and a single bond for linking the aromatic hydrocarbon skeletons. In the present invention, the hole transport material has a triplet level $T_1$ of 1.8 eV or more. In the present invention, the hole transport material has a hole mobility of $1 \times 10^{-5}$ cm$^2$/Vs or more. In the present invention, the hole transport layer and the emission layer satisfy relationships represented by the following expression (1):

$$|\text{reduction potential of hole transport material}|-|\text{reduction potential of host}| > 0.1 \text{ V} \quad (1)$$

and the following expression (2):

$$|\text{HOMO level of hole transport material} - \text{HOMO level of host}| < 0.1 \text{ eV} \quad (2).$$

Hereinafter, an embodiment of the present invention is described in detail with reference to the drawings. However, the present invention is not limited to the embodiment to be described below. In addition, it is easy for a person skilled in the art to understand that (at least part of) the form and details of the present invention can be variously modified as long as the modifications do not depart from the gist and scope thereof.

Figure 1:
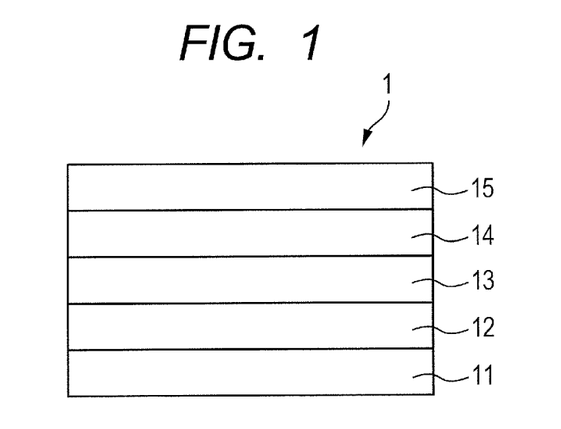
FIG. 1 is a schematic sectional view illustrating an example of an organic light emitting element according to one embodiment of the present invention.

FIG. 1 is a schematic sectional view illustrating an example of the organic light emitting element according to one embodiment of the present invention. In an organic light emitting element 1 of FIG. 1, an anode 11, a hole injection layer 12, a hole transport layer 13, an emission layer 14, and a cathode 15 are laminated in the stated order. It should be noted that in the organic light emitting element 1 of FIG. 1, an electrode (lower electrode) to be formed on a substrate (not shown) may be the anode 11 or may be the cathode 15.

In the organic light emitting element 1 of FIG. 1, a laminate formed of the hole injection layer 12, the hole transport layer 13, and the emission layer 14 corresponds to the organic compound layer for forming the organic light emitting element 1. In the present invention, layers for forming the organic compound layer are not limited to the hole injection layer 12, the hole transport layer 13, and the emission layer 14. For example, an intervening layer such as a hole blocking layer, an electron transport layer, or an electron injection layer may be appropriately formed between the emission layer 14 and the cathode 15.

Although the emission layer 14 is illustrated as a single layer in the organic light emitting element 1 of FIG. 1, the present invention is not limited thereto and the emission layer 14 may be a laminate formed of multiple layers.

Hereinafter, constituent members for the organic light emitting element 1 of FIG. 1 are described.

A constituent material for the anode 11 is desirably an inorganic compound having as large a work function as possible. Examples thereof include: metal simple substances such as gold, platinum, copper, nickel, palladium, cobalt, selenium, vanadium, and tungsten, or alloys obtained by mixing multiple kinds of these metal simple substances; and metal oxides such as tin oxide, zinc oxide, indium tin oxide (ITO), and indium zinc oxide. One kind of those inorganic compounds (electrode substances) may be used alone, or two or more kinds thereof may be used in combination. In addition, the anode 11 may be constituted of a single layer, or may be constituted of multiple layers.

The hole injection layer 12 is a layer formed of a material that efficiently injects a hole from the anode 11 and efficiently injects the hole into the hole transport layer 13, i.e., a hole injection material. In the present invention, a constituent material for the hole injection layer 12, which is not particularly limited, is preferably a tetracyanoquinodimethane derivative or a hexaazatriphenylene derivative.

Specific examples of the hole injection material include NDP-9 manufactured by Novaled and HAT-CN manufactured by Luminescence Technology. However, the material is not particularly limited as long as the material does not crystallize and can form a stable single layer film. It should be noted that a compound having predetermined physical properties are preferably used in the hole injection material. The predetermined physical properties are described later.

The hole transport layer 13 is a layer formed for transporting a hole injected from the hole injection layer 12 to the emission layer 14. In the present invention, the hole transport layer 13 includes a hole transport material having multiple aromatic hydrocarbon skeletons and a single bond for linking the aromatic hydrocarbon skeletons. In addition, in the present invention, the hole transport material in the hole transport layer 13 has a triplet level $T_1$ of 1.8 eV or more, and the hole transport material has a hole mobility of $1 \times 10^{-5}$ cm$^2$/Vs or more. It should be noted that the hole transport material is preferably a compound except an anthracene derivative (compound having an anthracene skeleton) because the anthracene skeleton out of the aromatic hydrocarbon skeletons does not satisfy the requirement concerning the triplet level ($T_1 \geq 1.8$ eV). In the present invention, preferred examples of the hole transport material include a phenylene derivative, a fluorene derivative, a chrysene derivative, and a pyrene derivative. However, the material is not particularly limited as long as the material is a compound except the anthracene derivative (compound free of any anthracene skeleton).

It should be noted that the aromatic hydrocarbon skeletons of the compound to be used as the hole transport material may each further have an alkyl group such as a methyl group, an ethyl group, an isopropyl group, or a tert-butyl group. In addition, the hole transport material as a constituent material for the hole transport layer 13 needs to satisfy some of the requirements concerning material physical properties. Details about the requirements are described later.

The emission layer 14 is a layer including a host and a dopant (guest). It should be noted that in the present invention, materials in the emission layer 14 are not limited only to the host and the dopant.

A compound serving as the host in the emission layer 14, which is not particularly limited, is preferably a pyrene derivative. It should be noted that the compound serving as the host needs to satisfy some of the requirements concerning the material physical properties. The details about the requirements are described later.

A compound serving as the dopant (guest) in the emission layer 14, which is not particularly limited, is preferably an electron trapping material. The material improves a carrier balance in the emission layer 14, which leads to an improvement in luminous efficiency of the organic light emitting element. The electron trapping material serving as the dopant is, for example, a compound containing a fluoranthene skeleton in its main chain. It should be noted that the compound containing a fluoranthene skeleton in its main chain is not limited to a compound in which the very fluoranthene skeleton is incorporated, and includes a condensed polycyclic compound obtained by further condensing a ring structure such as a benzene ring to the fluoranthene skeleton.

The color of light output from the emission layer 14 is not particularly limited and may be a white color. Here, when white light is output from the emission layer 14, multiple kinds of light (such as red light, green light, and blue light) need to be output from the emission layer 14.

A method involving incorporating multiple kinds of guests into the emission layer 14 is available as a method of causing the emission layer 14 to output multiple kinds of light. Here, when the emission layer 14 is a single layer, the emission layer 14 is in a state of including the multiple kinds of guests. At this time, at least one kind of the guests in the emission layer 14 is preferably a material that emits light having a color different from that of any other guest. Meanwhile, when the emission layer 14 is a laminate formed of multiple layers, each layer for forming the emission layer 14 contains at least one kind of guest. In addition, when the emission layer 14 is a laminate formed of multiple layers as described above, at least one layer of the layers for forming the emission layer 14 is preferably a layer that emits light having a color different from that of any other layer for forming the emission layer 14.

A constituent material for the cathode 15 desirably has a small work function. Examples thereof include: alkali metals such as lithium; alkaline earth metals such as calcium; and metal simple substances such as aluminum, titanium, manganese, silver, lead, and chromium. Alternatively, an alloy obtained by combining these metal simple substances may also be used. For example, magnesium-silver, aluminum-lithium, or aluminum-magnesium may be used. It is also possible to utilize a metal oxide such as indium tin oxide (ITO). One kind of those electrode substances may be used alone, or multiple kinds thereof may be used in combination. In addition, the cathode 15 may be constituted of a single layer, or may be constituted of multiple layers.

In addition, at least one of the anode 11 and the cathode 15 is desirably a transparent or semitransparent electrode from the viewpoint of extracting light output from the emission layer 14.

(2) Requirements Concerning Material Physical Properties

In the present invention, with regard to the material physical properties of the constituent materials for the organic light emitting element, requirements to be described below need to be satisfied or are preferably satisfied.

(2-1) Triplet Level ($T_1$)

The triplet level ($T_1$) is the energy level of a compound brought into the lowest triplet excited state. In other words, the lowest triplet excited energy of the compound of interest corresponds to the $T_1$. In the present invention, the $T_1$ of the hole transport material in the hole transport layer needs to be 1.8 eV or more.

(2-2) Hole Mobility ($\mu_h$)

A hole mobility $\mu_h$ is obtained by quantifying the ease with which a hole moves in a solid substance. Herein, a larger value for the $\mu_h$ means that the hole more easily moves.

In the present invention, the hole mobility $\mu_h$ of the hole transport material needs to be $1 \times 10^3$ cm$^2$/Vs or more.

(2-3) Oxidation Potential, Reduction Potential

An oxidation potential is a numerical value representing power for oxidizing a compound except the compound of interest in terms of a potential. In contrast, a reduction potential is a numerical value representing power for reducing a compound except the compound of interest in terms of a potential.

In the present invention, the following expression (1) needs to be satisfied.

$$|\text{reduction potential of hole transport material}|-|\text{reduction potential of host material}|>0.1 \text{ V} \quad (1)$$

The expression (1) is an expression representing electron blocking property at an interface between the hole transport layer 13 and the emission layer 14, i.e., electron trapping performance in the emission layer 14. In the present invention, an electron injected into the emission layer 14 can be trapped in the emission layer 14 by satisfying the expression (1).

(2-4) HOMO Level

A HOMO level is the energy level of the highest occupied molecular orbital of the compound of interest.

In the present invention, with regard to the hole transport material, the following expression (2) as well as the requirement concerning the hole mobility needs to be satisfied.

$$|\text{HOMO level of hole transport material}-\text{HOMO level of host}|<0.1 \text{ eV} \quad (2)$$

Satisfying the relational expression can reduce a barrier for the injection of a hole from the hole transport layer 13 into the emission layer 14, and hence can eliminate a hole accumulated at the interface between the hole transport layer 13 and the emission layer 14. The elimination of the accumulated hole can reduce charge quenching occurring near the emission layer 14.

(2-5) Suitable Requirements Concerning Material Physical Properties

In addition, a host in an emission layer that emits blue light generally has an HOMO level of about 6.0 eV, and hence the property by which a hole is injected from an anode is poor as compared to emission layers for a red color and a green color. Accordingly, the hole injection properties of the materials to be used in the hole injection layer 12 and the hole transport layer 13 are improved by setting the HOMO levels of the materials so that the levels may change stepwise.

In the present invention, however, the property by which a hole is injected from the anode 11 also needs to be taken into consideration because the HOMO level of the hole transport material and the HOMO level of the host are close to each other. In view of the foregoing, in the present invention, a hole injection material having a low reduction potential is preferably used in the hole injection layer 12. Specifically, the following expression (3) and the following expression (4) are preferably satisfied.

$$|\text{oxidation potential of hole transport material}|-|\text{reduction potential of hole injection material}|<1.4 \text{ V} \quad (3)$$

$$|\text{HOMO of hole injection material}|>|\text{HOMO of hole transport material}| \quad (4)$$

When the requirements represented by the expression (3) and the expression (4) are satisfied, an electron can be withdrawn from the hole transport material and hence a hole can be produced in the hole transport layer.

Satisfying the requirements described above allows an organic light emitting element utilizing fluorescence, in particular, an organic light emitting element whose luminescent color is a blue color to be an organic light emitting element excellent in luminous efficiency and durability without causing any increase in driving voltage.

(3) Applications of Organic Light Emitting Element

The organic light emitting element of the present invention may be used as a constituent member for a display apparatus or a lighting apparatus. In addition, the element finds applications in, for example, a light source for exposure of an electrophotographic image forming apparatus, a backlight of a liquid crystal display apparatus, and a light emitting apparatus including a white light source and a color filter. Examples of the color filter include filters that transmit three colors, i.e., red, green, and blue.

A display apparatus of the present invention includes the organic light emitting element of the present invention in a display portion. It should be noted that the display portion includes multiple pixels.

In addition, the pixels each include the organic light emitting element of the present invention and a transistor as an example of an active element (a switching element) or amplifier for controlling an emission luminance, and the anode or cathode of the organic light emitting element and the drain electrode or source electrode of the transistor are electrically connected. Here, the display apparatus can be used as an image display apparatus for a PC or the like. The transistor is, for example, a TFT element and the TFT element is provided on, for example, the insulating surface of the substrate. In addition, the TFT element preferably includes an electrode formed of a transparent oxide semiconductor.

The display apparatus may be an image information processing apparatus that includes an image input portion for inputting image information from an area CCD, a linear CCD, a memory card, or the like, and displays the input image to the display portion.

In addition, the display portion of an imaging apparatus or an ink-jet printer may have a touch panel function. The driving system of the touch panel function is not particularly limited.

In addition, the display apparatus may be used in the display portion of a multi-function printer.

A lighting apparatus is an apparatus for lighting, for example, the interior of a room. The lighting apparatus may emit light of any one of a white color (having a color temperature of 4,200 K), a neutral white color (having a color temperature of 5,000 K), and blue to red colors.

A lighting apparatus of the present invention includes the organic light emitting element of the present invention and an AC/DC converter circuit (circuit for converting an AC voltage into a DC voltage) to be connected to the organic light emitting element, for supplying a driving voltage to the organic light emitting element. It should be noted that the lighting apparatus may further include a color filter.

An image forming apparatus of the present invention is an image forming apparatus including: a photosensitive member; a charging portion for charging the surface of the photosensitive member; an exposing portion for exposing the photosensitive member to form an electrostatic latent image; and a developing portion for developing the electrostatic latent image formed on the surface of the photosensitive member. Here, exposing means to be provided in the image forming apparatus, e.g., an exposing device includes the organic light emitting element of the present invention.

In addition, the organic light emitting element of the present invention can be used as a constituent member (emitting member) for an exposing device for exposing a photosensitive member. The exposing device including the organic light emitting element of the present invention includes, for example, at least one emitting point including the organic light emitting element of the present invention and an active element connected to the organic light emitting element of the present invention. The unit preferably includes multiple emitting points. In addition, the emitting points are arrayed along a predetermined linear direction (such as the long axis direction of the photosensitive member).

Figure 2:
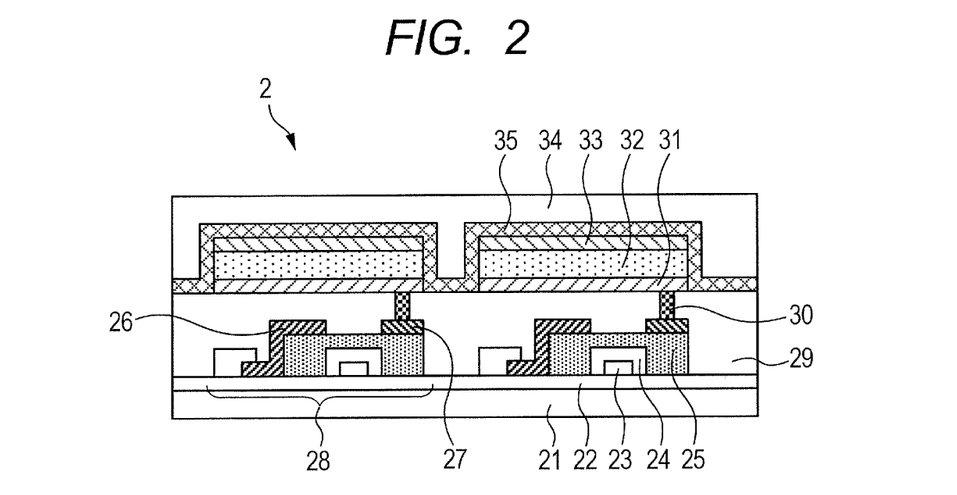
FIG. 2 is a schematic sectional view illustrating an example of a display apparatus including the organic light emitting element of the present invention and an active element connected to the organic light emitting element.

Next, the display apparatus of the present invention is described with reference to the drawings. FIG. 2 is a schematic sectional view illustrating an example of a display apparatus including an organic light emitting element and a switching element connected to the organic light emitting element. It should be noted that the organic light emitting element of the present invention is used as the organic light emitting element for forming a display apparatus 2 of FIG. 2.

The display apparatus 2 of FIG. 2 includes a substrate 21 such as glass and a moisture preventing film 22 for protecting a TFT element 28 as a switching element or an organic compound layer on the substrate. In addition, a metal gate electrode 23 is represented by reference numeral 23. A gate insulating film is represented by reference numeral 24 and a semiconductor layer is represented by reference numeral 25.

The TFT element 28 includes the semiconductor layer 25, a drain electrode 26, and a source electrode 27. An insulating film 29 is formed on the TFT element 28. An anode 31 for forming the organic light emitting element and the source electrode 27 are connected through a contact hole 30.

It should be noted that the system of the electrical connection of the electrode (anode or cathode) in the organic light emitting element and the electrode (source electrode or drain electrode) in the TFT is not limited to the embodiment illustrated in FIG. 2. In other words, one of the anode and the cathode, and one of the source electrode and drain electrode of the TFT element have only to be electrically connected.

In the display apparatus 2 of FIG. 2, multiple organic compound layers are illustrated like one layer but an organic compound layer 32 may be multiple layers. Formed on a cathode 33 are a first protective layer 34 and second protective layer 35 for suppressing the deterioration of the organic light emitting element.

When the display apparatus 2 of FIG. 2 is a display apparatus that emits white light, the emission layer in the organic compound layer for forming the organic light emitting element 1 of FIG. 1 may be a layer obtained by mixing a red light emitting material, a green light emitting material, and a blue light emitting material. In addition, the emission layer may be a laminated emission layer obtained by laminating a layer formed of the red light emitting material, a layer formed of the green light emitting material, and a layer formed of the blue light emitting material.

Further, alternatively, an embodiment in which the layer formed of the red light emitting material, the layer formed of the green light emitting material, and the layer formed of the blue light emitting material are arranged side by side to form domains in one emission layer is permitted.

Although the transistor is used as a switching element in the display apparatus 2 of FIG. 2, an MIM element may be used as a switching element instead of the transistor.

In addition, the transistor used in the display apparatus 2 of FIG. 2 is not limited to a transistor using a monocrystalline silicon wafer and may be a thin-film transistor having an active layer on the insulative surface of a substrate. A thin-film transistor using monocrystalline silicon as an active layer, a thin-film transistor using non-monocrystalline silicon such as amorphous silicon or microcrystalline silicon as an active layer, or a thin-film transistor using a non-monocrystalline oxide semiconductor such as an indium zinc oxide or an indium gallium zinc oxide as an active layer is also permitted. It should be noted that the thin-film transistor is called a TFT element as well.

The transistor in the display apparatus 2 of FIG. 2 may be formed in a substrate such as an Si substrate. Herein, the phrase "formed in a substrate" means that the transistor is produced by processing the substrate itself such as the Si substrate. In other words, the presence of the transistor in the substrate can be interpreted as follows: the substrate and the transistor are integrally formed.

Whether or not the transistor is provided in the substrate is selected depending on a definition. In the case of, for example, a definition of about a QVGA per inch, the organic light emitting element is preferably provided in the Si substrate.

As described above, an image having good quality can be stably displayed for a long time period by driving the display apparatus using the organic light emitting element of the present invention.

Example 1

In this example (Example 1), an organic light emitting element including an anode, a hole injection layer, a hole transport layer, an emission layer, a hole blocking layer, an electron transport layer, an electron injection layer, and a cathode laminated in the stated order on a substrate was produced by a method to be described below. Part of the materials used in this example are listed below.

Compound 4

Compound 5

First, indium tin oxide (ITO) was formed into a film on a glass substrate (substrate) by a sputtering method to form the anode. At this time, the thickness of the anode was set to 110 nm. Next, the substrate on which the anode had been formed was subjected to ultrasonic cleaning with acetone and isopropyl alcohol (IPA) sequentially. Next, the cleaned product was subjected to boil cleaning with IPA, followed by drying. Further, the dried product was subjected to UV/ozone cleaning. The substrate with the anode treated as described above was used as a transparent and conductive supporting substrate in a next step.

Next, NDP-9 (manufactured by Novaled) was formed into a film by a vacuum deposition method to form the hole injection layer. At this time, the thickness of the hole injection layer was set to 4 nm. Next, Compound 1 was formed into a film on the hole injection layer by the vacuum deposition method to form the hole transport layer. At this time, the thickness of the hole transport layer was set to 106 nm. Next, Compound 2 (host) and Compound 3 (dopant) were co-deposited from the vapor from boats different from each other to form the emission layer on the hole transport layer. At this time, the thickness of the emission layer was set to 25 nm and the concentration of the dopant in the emission layer was set to 1 wt %. Next, Compound 4 was formed into a film on the emission layer by the vacuum deposition method to form the hole blocking layer. At this time, the thickness of the hole blocking layer was set to 15 nm. Next, Compound 5 was formed into a film on the hole blocking layer by the vacuum deposition method to form the electron transport layer. At this time, the thickness of the electron transport layer was set to 15 nm.

It should be noted that upon formation of each of the hole injection layer, the hole transport layer, the emission layer, the hole blocking layer, and the electron transport layer described above, vapor deposition was performed under the conditions of a degree of vacuum of $2.0 \times 10^{-5}$ Pa or less and a film formation rate of 0.08 nm/sec or more and 0.10 nm/sec or less. It should be noted that the film formation rate upon formation of the emission layer was the sum of the deposition rate of the host and the deposition rate of the dopant. In addition, a vacuum state was maintained for at most 10 minutes during a time period commencing on the completion of the formation of the hole transport layer and ending on the initiation of the formation of the emission layer, and the vacuum state was also maintained for at most 10 minutes during a time period commencing on the completion of the formation of the emission layer and ending on the initiation of the formation of the electron transport layer.

Next, lithium fluoride (LiF) was formed into a film on the electron transport layer by the vacuum deposition method to form the electron injection layer. At this time, the thickness of the electron injection layer was set to 0.5 nm, and the vapor deposition was performed under the conditions of a degree of vacuum of $3.0 \times 10^{-5}$ Pa and a film formation rate of 0.05 nm/sec. Next, aluminum was formed into a film on the electron injection layer by the vacuum deposition method to form a cathode (electron injection electrode). At this time, the thickness of the cathode was set to 120 nm, and the vapor deposition was performed at a degree of vacuum of $3.0 \times 10^{-5}$ Pa and a film formation rate of 0.8 nm/sec or more and 1.2 nm/sec or less.

Finally, the resultant element was covered with a protective glass plate in a nitrogen atmosphere having a dew point of −70° C. or less so that moisture adsorption did not occur, followed by sealing with an epoxy-based adhesive material. It should be noted that an excavation was provided on the adhesive surface side of the protective glass, and a sheet for moisture adsorption (moisture getter sheet for an organic EL, manufactured by DYNIC CORPORATION) was encapsulated therein.

Thus, the organic light emitting element was obtained.

Comparative Example 1

An organic light emitting element was obtained by the same method as that of Example 1 except that in Example 1, a hole transport layer was formed by using Compound 6 shown below and Compound 6 was used as a host to be incorporated into an emission layer.

Compound 6

Comparative Example 2

An organic light emitting element was obtained by the same method as that of Example 1 except that in Example 1, a hole transport layer was formed by using Compound 7 shown below and Compound 6 was used as a host to be incorporated into an emission layer.

Compound 7

Comparative Example 3

An organic light emitting element was obtained by the same method as that of Example 1 except that in Example 1, Compound 8 shown below was used as a host to be incorporated into an emission layer.

Compound 11

Compound 8

Comparative Example 4

An organic light emitting element was obtained by the same method as that of Example 1 except that in Example 1, a hole transport layer was formed by using Compound 9 shown below and Compound 10 shown below was used as a host to be incorporated into an emission layer.

Example 2

An organic light emitting element was obtained by the same method as that of Example 1 except that in Example 1, Compound 10 shown below was used as a host to be incorporated into an emission layer.

Compound 9

Compound 10

Compound 12

Example 3

Reference Example 1

An organic light emitting element was obtained by the same method as that of Example 1 except that in Example 1, a hole transport layer was formed by using Compound 11 shown below and Compound 6 was used as a host to be incorporated into an emission layer.

In this example (Example 3), an organic light emitting element including an anode, a hole injection layer, a hole transport layer, a first emission layer, a second emission layer, a hole blocking layer, an electron transport layer, an electron injection layer, and a cathode laminated in the stated order on a substrate was produced by a method to be described below. Here, part of the materials used in this example are listed below.

Compound 1

Compound 3

Compound 4

Compound 5

Compound 6

Compound 10

First, indium tin oxide (ITO) was formed into a film on a glass substrate (substrate) by a sputtering method to form the anode. At this time, the thickness of the anode was set to 110 nm. Next, the substrate on which the anode had been formed was subjected to ultrasonic cleaning with acetone and isopropyl alcohol (IPA) sequentially. Next, the cleaned product was subjected to boil cleaning with IPA, followed by drying. Further, the dried product was subjected to UV/ozone cleaning. The substrate with the anode treated as described above was used as a transparent and conductive supporting substrate in a next step.

Next, NDP-9 (manufactured by Novaled) was formed into a film by a vacuum deposition method to form the hole injection layer. At this time, the thickness of the hole injection layer was set to 4 nm. Next, Compound 1 was formed into a film on the hole injection layer by the vacuum deposition method to form the hole transport layer. At this time, the thickness of the hole transport layer was set to 106 nm. Next, Compound 6 (host) and Compound 3 (dopant) were co-deposited from the vapor from boats different from each other to form the first emission layer on the hole transport layer. At this time, the thickness of the first emission layer was set to 20 nm and the concentration of the dopant in the first emission layer was set to 1 wt %. Next, Compound 10 (host) and Compound 3 (dopant) were co-deposited from the vapor from boats different from each other to form the second emission layer on the first emission layer. At this time, the thickness of the second emission layer was set to 5 nm and the concentration of the dopant in the second emission layer was set to 1 wt %. Next, Compound 4 was formed into a film on the second emission layer by the vacuum deposition method to form the hole blocking layer. At this time, the thickness of the hole blocking layer was set to 15 nm. Next, Compound 5 was formed into a film on the hole blocking layer by the vacuum deposition method to form the electron transport layer. At this time, the thickness of the electron transport layer was set to 15 nm.

It should be noted that upon formation of each of the hole injection layer, the hole transport layer, the first emission layer, the second emission layer, the hole blocking layer, and the electron transport layer described above, vapor deposition was performed under the conditions of a degree of vacuum of $2.0 \times 10^{-5}$ Pa or less and a film formation rate of 0.08 nm/sec or more and 0.10 nm/sec or less. It should be noted that the film formation rate upon formation of each of the emission layers was the sum of the deposition rate of the host and the deposition rate of the dopant. In addition, a vacuum state was maintained for at most 10 minutes during a time period commencing on the completion of the formation of the hole transport layer and ending on the initiation of the formation of the first emission layer, and the vacuum state was also maintained for at most 10 minutes during a time period commencing on the completion of the formation of the second emission layer and ending on the initiation of the formation of the electron transport layer.

Next, lithium fluoride (LiF) was formed into a film on the electron transport layer by the vacuum deposition method to form the electron injection layer. At this time, the thickness of the electron injection layer was set to 0.5 nm, and the vapor deposition was performed under the conditions of a degree of vacuum of $3.0 \times 10^{-5}$ Pa and a film formation rate of 0.05 nm/sec. Next, aluminum was formed into a film on the electron injection layer by the vacuum deposition method to form a cathode (electron injection electrode). At this time, the thickness of the cathode was set to 120 nm, and the vapor deposition was performed at a degree of vacuum of $3.0\times10^{-5}$ Pa and a film formation rate of 0.8 nm/sec or more and 1.2 nm/sec or less.

Finally, the resultant element was covered with a protective glass plate in a nitrogen atmosphere having a dew point of $-70°$ C. or less so that moisture adsorption did not occur, followed by sealing with an epoxy-based adhesive material. It should be noted that an excavation was provided on the adhesive surface side of the protective glass, and a sheet for moisture adsorption (moisture getter sheet for an organic EL, manufactured by DYNIC CORPORATION) was encapsulated therein.

Thus, the organic light emitting element was obtained.

Example 4

An organic light emitting element was obtained by the same method as that of Example 3 except that in Example 3, Compound 12 was used as a host upon formation of a second emission layer.

(Physical Properties of Hole Transport Material and Host)

Here, compounds used as a constituent material for a hole transport layer (hole transport material) and a host out of the materials used in any one of Examples, Comparative Examples, and Reference Example were evaluated for the following physical properties.

(1) Triplet Level ($T_1$)

A $T_1$ was calculated by employing the following calculation method. Table 1 shows the calculated value.

(1-1) Structure Optimization
Calculation method: Density functional theory (DFT)
Functional: B3LYP
Basis function: def2-SV(P)
Software: TURBOMOLE (1-2) Excited Lowest Triplet (Absorption) Excitation Energy
Calculation method: Time-dependent density functional theory (TDDFT), density functional theory (DFT)
Functional: B3LYP
Basis function: def2-SV(P)
Software: TURBOMOLE:
TURBOMOLE V5.10 (see NPL 3)

(2) Hole mobility ($\mu_h$)

The hole mobility ($\mu_h$) of the hole transport material was measured by a method to be described below.

First, an organic compound as a measuring object was formed into a film having a thickness of 2 μm on a glass substrate with ITO by a vacuum deposition method. After that, aluminum was subsequently formed into a film having a thickness of about 100 nm to provide an element for hole mobility measurement. The resultant element was covered with a protective glass plate in a nitrogen atmosphere having a dew point of $-70°$ C. or less so that moisture adsorption did not occur, followed by sealing with an epoxy-based adhesive material. It should be noted that an excavation was provided on the adhesive surface side of the protective glass, and a sheet for moisture adsorption (moisture getter sheet for an organic EL, manufactured by DYNIC CORPORATION) was encapsulated therein.

The hole mobility of the element was measured with a time-of-flight measuring apparatus (TOF-301 manufactured by NIHON OPTEL CORPORATION) in an electric field intensity of $1.0\times10^5$ V/cm. Table 1 shows the resultant measured value.

(3) Oxidation Potential, Reduction Potential

An oxidation potential and a reduction potential were measured by a cyclic voltammetry method. Here, members, sample, and measurement condition used upon measurement are described below. It should be noted that a measuring system used is a measuring system capable of simultaneously measuring an oxidation potential and a reduction potential.

Supporting electrolyte: tetrabutylammonium perchlorate (concentration: 0.1 mol/L)

Sample (oxidation potential measurement): a methylene chloride solution of an organic compound as a measuring object (concentration: $1\times10^{-4}$ mol/L or more and $1\times10^{-6}$ mol/L or less)

Sample (reduction potential measurement): an N,N-dimethylformamide solution of an organic compound as a measuring object (concentration: $1\times10^{-4}$ mol/L or more and $1\times10^{-6}$ mol/L or less)

Measurement temperature: 25° C.
Reference electrode: Ag/AgNO$_3$
Counter electrode: platinum electrode
Working electrode: glassy carbon The resultant measured value was converted into a potential value with ferrocene/ferrocenium (Fc/Fc$^+$). Table 1 shows the converted value.

(4) HOMO Level

An HOMO level was measured by a method to be described below.

First, an organic compound as a measuring object was formed into a film having a thickness of about 100 nm on a glass substrate with ITO, and then its spectrum was measured with a photoelectron spectrometer (AC-3 manufactured by Riken Keiki Co., Ltd.) under the air. Next, a photoelectron discharge threshold value was determined from the resultant spectrum and the threshold value was defined as the HOMO level (ionization potential). Table 1 shows the resultant value.

It should be noted that the measurement conditions were as described below.

Measured energy range: 5.00 eV or more and 7.00 eV or less
Energy interval: 0.05 eV
Counting time: 10 sec
Set quantity of light: 4 nW or more and 10 nW or less Here, Table 1 below summarizes the physical property values of the compounds used as the constituent materials for the hole transport layers (hole transport materials) and the compounds used as the hosts for the emission layers in Examples (Example 1 to Example 4), Comparative Examples (Comparative Example 1 to Comparative Example 4), and Reference Example 1.

TABLE 1

| | HOMO level (eV) | $T_1$ (eV) | Oxidation potential (V) | Reduction potential (V) | Hole mobility $\mu_h$ ($10^{-5}$ cm$^2$/V·S) |
|---|---|---|---|---|---|
| Compound 1 | 5.98 | 2.58 | 0.84 | −2.56 | 30 |
| Compound 2 | 5.98 | — | — | — | — |
| Compound 6 | 6.03 | 1.63 | 0.77 | −2.25 | — |
| Compound 7 | 5.94 | 2.03 | 0.75 | −2.39 | 2 |
| Compound 8 | 5.82 | — | — | — | — |
| Compound 9 | 6.04 | 2.38 | 0.9 | −2.42 | 44 |
| Compound 10 | 6.00 | — | — | — | — |
| Compound 11 | 6.12 | 2.39 | 1.09 | −2.49 | 100 |
| Compound 12 | 6.02 | — | — | — | — |

On the other hand, the physical properties of NDP9 are as described below.

LUMO: 5.10 eV$^{(Note\ 1)}$
Band gap (BG): 2.3 eV
Reduction potential: −0.37 V$^{(Note\ 2)}$ ((Note 1) A physical property value opened to the public by Novaled on its website and converted by cyclic voltammetry. (Note 2) A physical property value described in NPL 2.)

Here, the HOMO is represented by an expression "LUMO+BG" and can be estimated at 7.4 eV.

Accordingly, the NDP-9 used in Examples satisfies the following relationship.

|HOMO of hole injection material|>|HOMO of hole transport material|

(Results of Evaluations of Light Emitting Element and Considerations)

Each of the elements obtained in Examples and Comparative Examples was evaluated for its current-voltage characteristics and emission luminance by applying a voltage while using its ITO electrode (anode) and aluminum electrode (cathode) as a positive electrode and a negative electrode, respectively. It should be noted that the following apparatus were used upon evaluation of the current-voltage characteristics and the emission luminance.

Current-voltage characteristics: Microammeter 4140B manufactured by Hewlett-Packard Company Emission luminance: SR3 manufactured by TOPCON CORPORATION An energy relationship between the constituent material for the hole transport layer (hole transport material) and the host for the emission layer was considered based on the results of the evaluations of the resultant light emitting element and the results of the evaluations of the physical properties of the organic light emitting element when its luminance was set to 1,000 Cd/m² by using the following expressions (i) and (ii).

$\Delta E_1$=|HOMO level of hole transport material− HOMO level of host| (i)

$\Delta E_2$=|reduction potential of hole transport material|− |reduction potential of host| (ii)

Further, an energy relationship between the constituent material for the hole injection layer (hole injection material) and the constituent material for the hole transport layer (hole transport material) was considered by using the following expression (iii).

$\Delta E_3$=|oxidation potential of hole transport material|− |reduction potential of hole injection material| (iii)

Table 2 below shows the results of the considerations.

In Table 2, the organic light emitting element of Example 1 satisfies the following relationships (ia), (iia), and (iiia).

$\Delta E_1$<0.1 eV (ia)

$\Delta E_2$>0.1 V (iia)

$\Delta E_3$<1.4 V (iiia)

In addition, the organic light emitting element of Example 1 has a triplet level ($T_1$) of the hole transport material of 1.8 eV or more and a hole mobility $\mu_h$ of $1\times 10^{-5}$ cm²/Vs or more.

Therefore, the organic light emitting element of Example 1 was found to be an organic light emitting element that utilized fluorescence and emitted blue light, the element being excellent from the viewpoints of a driving voltage, luminous efficiency, and durability.

On the other hand, the luminous efficiency of the organic light emitting element of Comparative Example 1 was lower than that of the organic light emitting element of Example 1. This may result from the fact that the organic light emitting element of Comparative Example 1 did not satisfy the requirement concerning the triplet level ($T_1$) of the hole transport material ($\mu_1 \geq 1.8$ eV). In other words, when an anthracene derivative is used as a constituent material for the hole transport layer, the $T_1$ becomes of about the same magnitude as that of the triplet level of the host for the emission layer. Accordingly, no triplet exciton can be trapped in the emission layer. As a result, a triplet exciton leaks to the hole transport layer adjacent to the emission layer, which may lead to a reduction in luminous efficiency.

In addition, the driving voltage of the organic light emitting element of Comparative Example 2 was higher than that of the organic light emitting element of Example 1. This may result from the fact that the organic light emitting element of Comparative Example 2 did not satisfy the requirement concerning the hole mobility ($\mu_h$) ($\mu_h \geq 1\times 10^{-5}$ cm²/Vs). In other words, the fact that the hole mobility $\mu_h$ of the constituent material for the hole transport layer (hole transport material) may lead to an increase in voltage.

In addition, the luminous efficiency of the organic light emitting element of Comparative Example 3 was lower than that of the organic light emitting element of Example 1. This may result from the fact that the organic light emitting element of Comparative Example 3 did not satisfy the requirement concerning the $\Delta E_1$ ($\Delta E_1$<0.1 eV). In other words, when a difference between the HOMO level of the hole transport material and the HOMO level of the host for the emission layer is large, an interface between the hole transport layer and the emission layer serves as a hole injection barrier. When the interface between the hole transport layer and the emission layer serves as the hole injection

TABLE 2

| | Voltage (V) | CIEy at 1,000 Cd/m² | EQE (%) | Half lifetime (hrs) | $T_1$ of hole transport material (eV) | Hole mobility of hole transport material ($10^{-5}$ cm²/V·S) | $\Delta E_1$ (eV) | $\Delta E_2$ (eV) | $\Delta E_3$ (eV) |
|---|---|---|---|---|---|---|---|---|---|
| Example 1 | 4.5 | 0.18 | 8.0 | 26,000 | 2.58 | 30 | 0 | 0.23 | 1.21 |
| Comparative Example 1 | 4.6 | 0.14 | 2.7 | 1,000 | 1.63 | — | 0 | 0 | 1.14 |
| Comparative Example 2 | 5.2 | 0.13 | 5.5 | 12,000 | 2.03 | 0.9 | 0.09 | 0.14 | 1.12 |
| Comparative Example 3 | 4.5 | 0.17 | 4.3 | 9,000 | 2.58 | 30 | 0.16 | 0.27 | 1.21 |
| Comparative Example 4 | 4.8 | 0.15 | 5.0 | 6,000 | 2.38 | 44 | 0.04 | 0.10 | 1.27 |
| Reference Example 1 | 6.1 | 0.15 | 1.0 | 500 | 2.58 | 100 | 0.09 | 0.24 | 1.46 |
| Example 2 | 4.8 | 0.16 | 8.0 | 34,000 | 2.58 | 30 | 0.02 | 0.25 | 1.21 |
| Example 3 | 4.6 | 0.17 | 9.0 | 36,000 | 2.58 | 30 | 0.05 | 0.32 | 1.21 |
| Example 4 | 4.7 | 0.16 | 10.5 | 31,000 | 2.58 | 30 | 0.05 | 0.32 | 1.21 | barrier as described above, a hole may accumulate at the interface to cause the charge quenching of an exciton in the emission layer.

In addition, the luminous efficiency of the organic light emitting element of Comparative Example 4 was lower than that of the organic light emitting element of Example 1. This may result from the fact that the organic light emitting element of Comparative Example 4 did not satisfy the requirement concerning the $\Delta E_2$ ($\Delta E_2 > 0.1$ eV). In other words, unless a reduction potential difference between the hole transport material and the host exceeds 0.1 eV, an electron injected into the emission layer cannot be trapped in the emission layer, which may lead to a reduction in luminous efficiency.

In addition, the driving voltage of the organic light emitting element of Reference Example 1 was higher than that of the organic light emitting element of Example 1. This may result from the fact that the organic light emitting element of Reference Example 1 did not satisfy the requirement concerning the $\Delta E_3$ ($\Delta E_3 < 1.4$ eV). In other words, when a difference (potential difference) between the oxidation potential of the hole transport material and the reduction potential of the hole injection material is large, a state where an electron cannot be withdrawn from the hole transport material and hence a hole cannot be produced in the hole transport layer is established. Probably as a result of the foregoing, the driving voltage increased.

Meanwhile, the value for the $\Delta E_1$ of the organic light emitting element of Example 2 (0.02 eV) was larger than that of the organic light emitting element of Example 1, but the element was found to be excellent from the viewpoints of a driving voltage, luminous efficiency, and durability in the same manner as in Example 1 because the requirement concerning the $\Delta E_1$ was satisfied.

In addition, the organic light emitting elements of Example 3 and Example 4 each satisfy the requirements (ia), (iia), and (iiia), and the requirements concerning the $T_1$ and the $\mu_h$ in the same manner as in Example 1, though the emission layer of each of the elements is formed of multiple layers (a first emission layer and a second emission layer) unlike the organic light emitting element of Example 1. Accordingly, the elements were each found to be excellent from the viewpoints of a driving voltage, luminous efficiency, and durability in the same manner as in Example 1.

The external quantum efficiencies of the organic light emitting elements of Examples exceeded the upper limit (5%) of the related art and achieved 10.5% at maximum. In addition, each of the elements has a low voltage (driving voltage) at a practical luminance of 1,000 Cd/m$^2$ and good durability. Accordingly, the organic light emitting element of the present invention may be sufficiently competent to be used even as a blue light emitting component in a display or lighting.

According to one embodiment of the present invention, it is possible to provide the organic light emitting element, in particular, the organic light emitting element that emits blue light, which has a low driving voltage, and is excellent in luminous efficiency and durability.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-122500, filed Jun. 11, 2013, which is hereby incorporated by reference herein in its entirety.

REFERENCE SIGNS LIST

1: organic light emitting element, 11: anode, 12: hole injection layer, 13: transport layer, 14: emission layer, 15: cathode

The invention claimed is:

1. An element comprising:
   an anode;
   a cathode; and
   an organic compound layer disposed between the anode and the cathode and including a hole injection layer, a hole transport layer, and an emission layer,
   wherein the emission layer includes a host and a dopant, the hole transport layer includes a hole transport material, and the hole injection layer includes a hole injection material,
   wherein the hole transport layer satisfies a relationship represented by the following expression (3):

$$|\text{oxidation potential of hole transport material} - \text{reduction potential of hole injection material}| < 1.4 \text{ eV} \quad (3).$$

2. The element according to claim 1, wherein the host and the hole transport material satisfy the following expression (1):

$$|\text{reduction potential of hole transport material}| - |\text{reduction potential of host}| > 0.1 \text{ V} \quad (1).$$

3. The element according to claim 1, wherein the hole injection layer and the hole transport layer satisfy a relationship represented by the following expression (4):

$$|\text{HOMO level of hole injection material}| > |\text{HOMO level of hole transport material}| \quad (4).$$

4. The element according to claim 1, wherein the hole injection material comprises a hexaazatriphenylene derivative.

5. The element according to claim 1, wherein the hole transport material has a triplet level T1 of 1.8 eV or more.

6. The element according to claim 1, wherein the hole transport material has a triplet level T1 of 2.5 eV or more.

7. The element according to claim 1, wherein the hole transport material has a triplet level T1 of 2.3 eV or more.

8. The element according to claim 1, wherein the emission layer comprises a compound selected from the group consisting of a pyrene derivative, an anthracene derivative, and a triphenylene derivative.

9. The element according to claim 1, wherein the emission layer includes multiple kinds of dopants,
   wherein at least one kind of the multiple kinds of dopants comprises a material that emits light having a color different from a color emitted by another kind of dopant, and
   wherein the emission layer emits white light.

10. The element according to claim 1, wherein the emission layer comprises multiple layers,
    wherein at least one of the multiple layers emits light having a color different from a color emitted by another layer, and
    wherein the emission layer emits white light.

11. A display apparatus comprising multiple pixels, wherein at least one of the multiple pixels includes the element according to claim 1 and an active element connected to the element, and
    wherein at least part of the multiple pixels emits light to perform predetermined display.

12. A lighting apparatus comprising:
the element according to claim 1; and
an AC/DC converter circuit for supplying a driving voltage to the element.

13. The element according to claim 1, wherein the hole injection layer contacts the anode.

14. The element according to claim 1, wherein the anode is ITO, and the cathode is aluminum.

15. The element according to claim 1, wherein the hole transport material has a hole mobility of $1\times10^{-5}$ cm$^2$/Vs or more.

16. The element according to claim 2, wherein the hole transport material has a triplet level T1 of 1.8 eV or more.

17. The element according to claim 1, wherein the emission layer comprises a compound selected from the group consisting of a pyrene derivative and a triphenylene derivative.

18. The element according to claim 10, wherein the hole transport material has a triplet level T1 of 1.8 eV or more.

19. The element according to claim 18, wherein the emission layer comprises a compound selected from the group consisting of a pyrene derivative and a triphenylene derivative.

20. The element according to claim 18, wherein the host and the hole transport material satisfy the following expression (1):

$$|\text{reduction potential of hole transport material}| - |\text{reduction potential of host}| > 0.1 \text{ V} \quad (1).$$

\* \* \* \* \*